United States Patent
Itoh

(10) Patent No.: US 9,190,801 B2
(45) Date of Patent: Nov. 17, 2015

(54) METHOD AND APPARATUS FOR DETECTION OF FAILURE OF AN OPTICAL AMPLIFIER

(71) Applicant: FUJITSU LIMITED, Kawasaki-shi, Kanagawa (JP)

(72) Inventor: Hiroyuki Itoh, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 174 days.

(21) Appl. No.: 14/056,509

(22) Filed: Oct. 17, 2013

(65) Prior Publication Data

US 2014/0158867 A1 Jun. 12, 2014

(30) Foreign Application Priority Data

Dec. 6, 2012 (JP) ................................. 2012-267145

(51) Int. Cl.
| | |
|---|---|
| *H01S 3/067* | (2006.01) |
| *H01S 3/10* | (2006.01) |
| *H01S 3/13* | (2006.01) |
| *H01S 3/00* | (2006.01) |
| *H04B 10/079* | (2013.01) |
| *H04B 10/291* | (2013.01) |
| *H01S 3/0941* | (2006.01) |
| *H01S 5/0683* | (2006.01) |

(52) U.S. Cl.
CPC ........... *H01S 3/06754* (2013.01); *H01S 3/0014* (2013.01); *H01S 3/10015* (2013.01); *H01S 3/1301* (2013.01); *H04B 10/0797* (2013.01); *H04B 10/07955* (2013.01); *H04B 10/2918* (2013.01); *H01S 3/09415* (2013.01); *H01S 3/10069* (2013.01); *H01S 5/0683* (2013.01)

(58) Field of Classification Search
CPC .............. H01S 3/0014; H01S 3/06754; H01S 3/09415; H01S 3/10015; H01S 3/1301; H01S 5/0683; H04B 10/07955; H04B 10/0797; H04B 10/2918
See application file for complete search history.

(56) References Cited

U.S. PATENT DOCUMENTS

| | | | |
|---|---|---|---|
| 6,064,501 A | 5/2000 | Roberts et al. | |
| 2002/0097482 A1* | 7/2002 | Sasaoka et al. | 359/334 |
| 2004/0080812 A1* | 4/2004 | Sugaya et al. | 359/334 |
| 2006/0219878 A1* | 10/2006 | Yano | 250/227.11 |
| 2007/0189345 A1* | 8/2007 | Ko et al. | 372/29.021 |

FOREIGN PATENT DOCUMENTS

| | | |
|---|---|---|
| JP | 11-507189 | 6/1999 |
| JP | 2003-174420 | 6/2003 |

* cited by examiner

*Primary Examiner* — Francis M Lagasse, Jr.
(74) *Attorney, Agent, or Firm* — Staas & Halsey LLP

(57) ABSTRACT

An apparatus and method of failure detection in optical amplifier is disclosed. The optical amplifier includes an optical amplifying fiber configured to receive input light so that the input light travels through the optical amplifying fiber, an excitation light generator configured to supply excitation light to the optical amplifying fiber to optically amplify the input light as the input light travels through the optical amplifying fiber, and a processor configured to determine whether a failure has occurred in the optical amplifier, based on a change in power of the excitation light and a change in power of the input light.

19 Claims, 9 Drawing Sheets

Txp ; TRANSMITTER PACKAGE  MUX ; MULTIPLEXER
Rxp ; RECEIVER PACKAGE  DEMUX ; DE-MULTIPLEXER

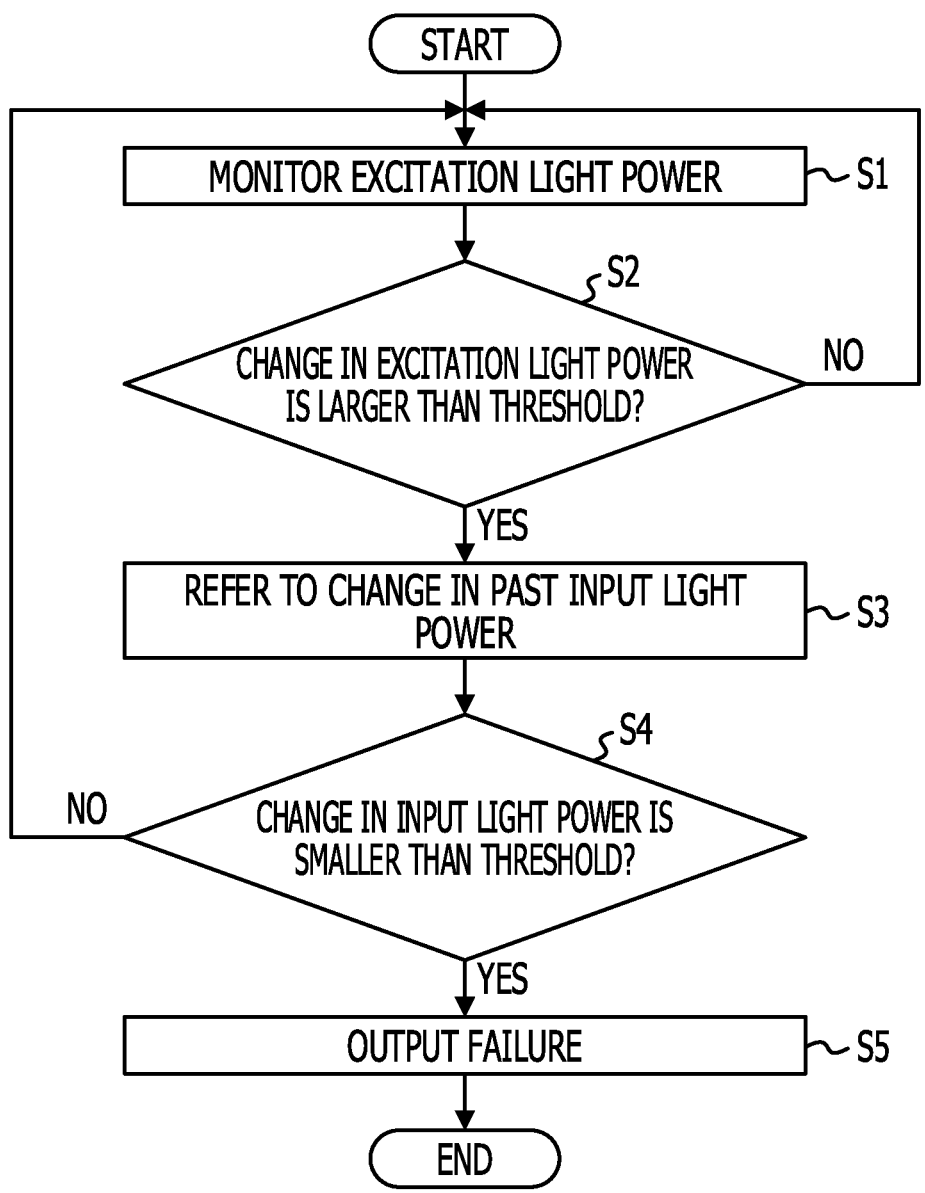

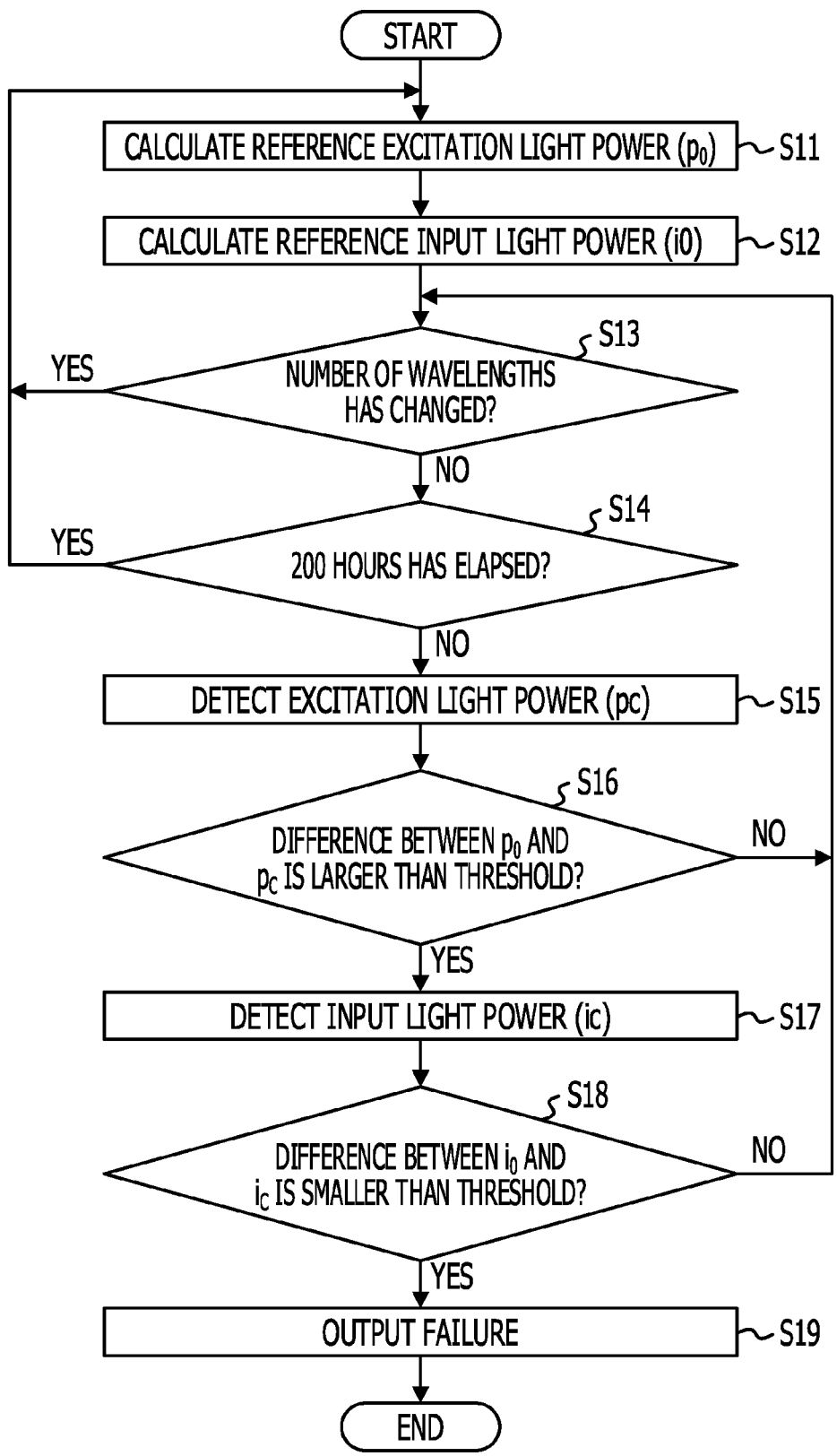

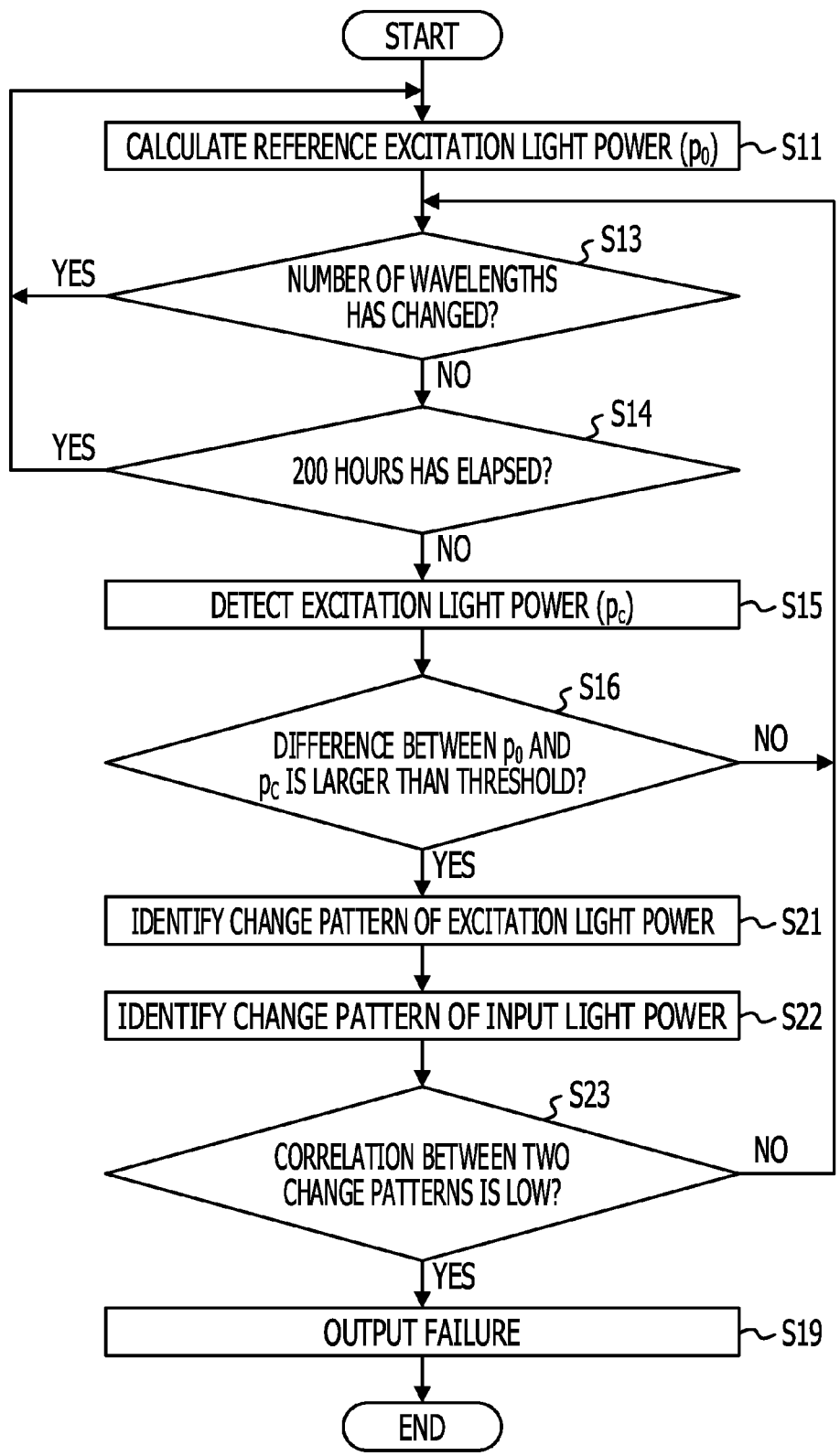

METHOD AND APPARATUS FOR DETECTION OF FAILURE OF AN OPTICAL AMPLIFIER

CROSS-REFERENCE TO RELATED APPLICATION

This application is based upon and claims the benefit of priority of the prior Japanese Patent Application No. 2012-267145, filed on Dec. 6, 2012, the entire contents of which are incorporated herein by reference.

FIELD

The embodiments discussed herein are related to an optical amplifier and a method for detecting a failure in an optical amplifier.

BACKGROUND

Optical communication systems have recently become widespread, and optical amplifiers are being used in various communication devices. For example, optical amplifiers are used in optical transmission devices, such as an optical transmitter, an optical receiver, an optical repeater and an optical add-drop multiplexer.

When used in optical transmission devices as mentioned above, optical amplifiers sometimes operate in an automatic gain control (AGC) mode in which an optical signal is amplified while the gain is maintained to be fixed. In the AGC mode, for example, the power of light input to an optical amplification medium (hereinafter referred to as "input light power") and the power of light output from the optical amplification medium (hereinafter referred to as "output light power") are monitored, and excitation light is controlled so that the ratio of the input light power to the output light power (that is, gain) is maintained to be fixed. Accordingly, when the input light power decreases, the control system of the optical amplifier reduces the power of excitation light so that the gain is maintained to be fixed. Similarly, when the input light power increases, the control system of the optical amplifier increases the power of excitation light so that the gain is maintained to be fixed.

An optical amplifier performs control as mentioned above and therefore is designed to include many optical components. When any one optical component breaks down, it becomes impossible for the optical amplifier to amplify an optical signal so as to obtain desired gain. For this reason, methods for detecting a failure in an optical amplifier have been proposed.

For example, when a laser light source for generating excitation light of an optical amplifier deteriorates, a control signal for increasing the power of excitation light is provided to the laser light source in order to maintain fixed gain. Accordingly, in this configuration, breakdown of a laser light source (or deterioration of the laser light source) is detected if the control signal mentioned above is monitored. In addition to this, for example, a method in which a failure in an optical amplifier is detected based on a change in output light power or a change in gain is known.

Japanese National Publication of International Patent Application No. 11-507189 and Japanese Laid-open Patent Publication No. 2003-174420 disclose examples of the related art.

If the input light power of an optical amplifier varies, the control system controls excitation light power in accordance with the variation of the input light power in order to maintain the gain to be fixed. In some cases, however, it is not possible to determine whether such a change in excitation light is caused by a variation in input light power or caused by a failure in an optical amplifier, only by monitoring excitation light or a control signal for generating excitation light. That is, with the related art technologies, whether a failure has occurred in an optical amplifier is not able to be correctly determined in some cases.

SUMMARY

According to an aspect of the invention, an optical amplifier includes an optical amplifying fiber configured to receive input light so that the input light travels through the optical amplifying fiber; an excitation light generator configured to supply excitation light to the optical amplifying fiber to optically amplify the input light as the input light travels through the optical amplifying fiber; and a processor configured to determine whether a failure has occurred in the optical amplifier, based on a change in power of the excitation light and a change in power of the input light.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a flowchart illustrating a failure detection method in the first embodiment;

FIG. 8 is a flowchart illustrating a failure detection method in a second embodiment; and FIG. 9 is a flowchart illustrating a failure detection method in a third embodiment.

DESCRIPTION OF EMBODIMENTS

Figure 1:
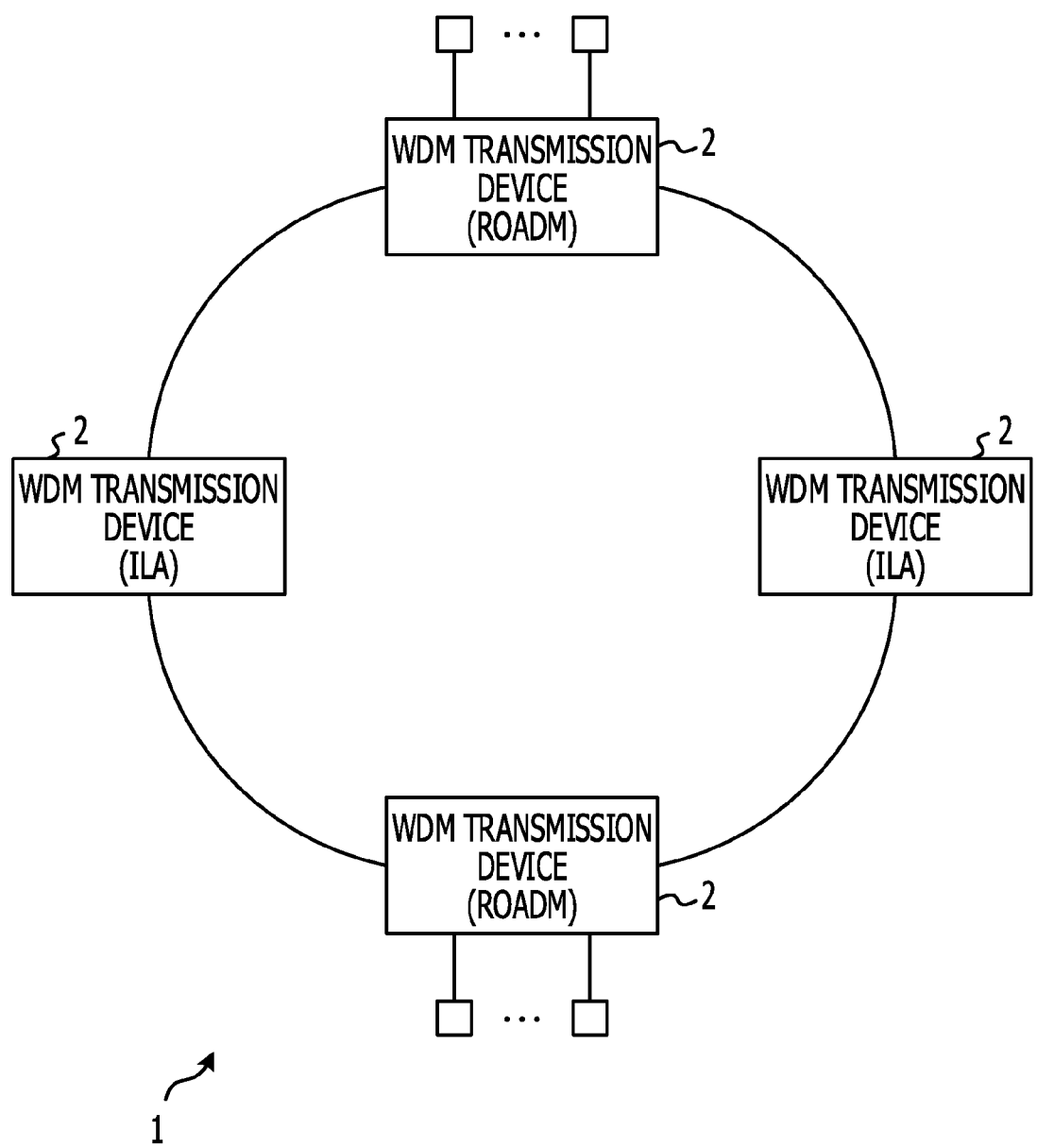
FIG. 1 illustrates an example of an optical transmission system according to embodiments of the present disclosure.

FIG. 1 illustrates an example of an optical transmission system according to embodiments of the present disclosure. In this example, an optical transmission system 1 is capable of transmitting wavelength division multiplexing (WDM) signals. That is, the optical transmission system 1 includes a plurality of WDM transmission devices 2. Each WDM transmission device 2 is a reconfigurable optical add-drop multiplexer (ROADM), for example. The WDM transmission device 2 is capable of causing a desired signal to branch off from a WDM signal, and guiding the desired signal to a device subordinate to the WDM transmission device 2. The WDM transmission device 2 is capable of inserting a signal received from a device subordinate thereto into a WDM signal. The ROADM also has a function of amplifying WDM signals in a collective manner. Each WDM transmission device 2 may be an optical in-line amplifier (ILA) provided on an optical transmission path. In this case, the WDM transmission device 2 amplifies WDM signals in a collective manner.

Figure 2:
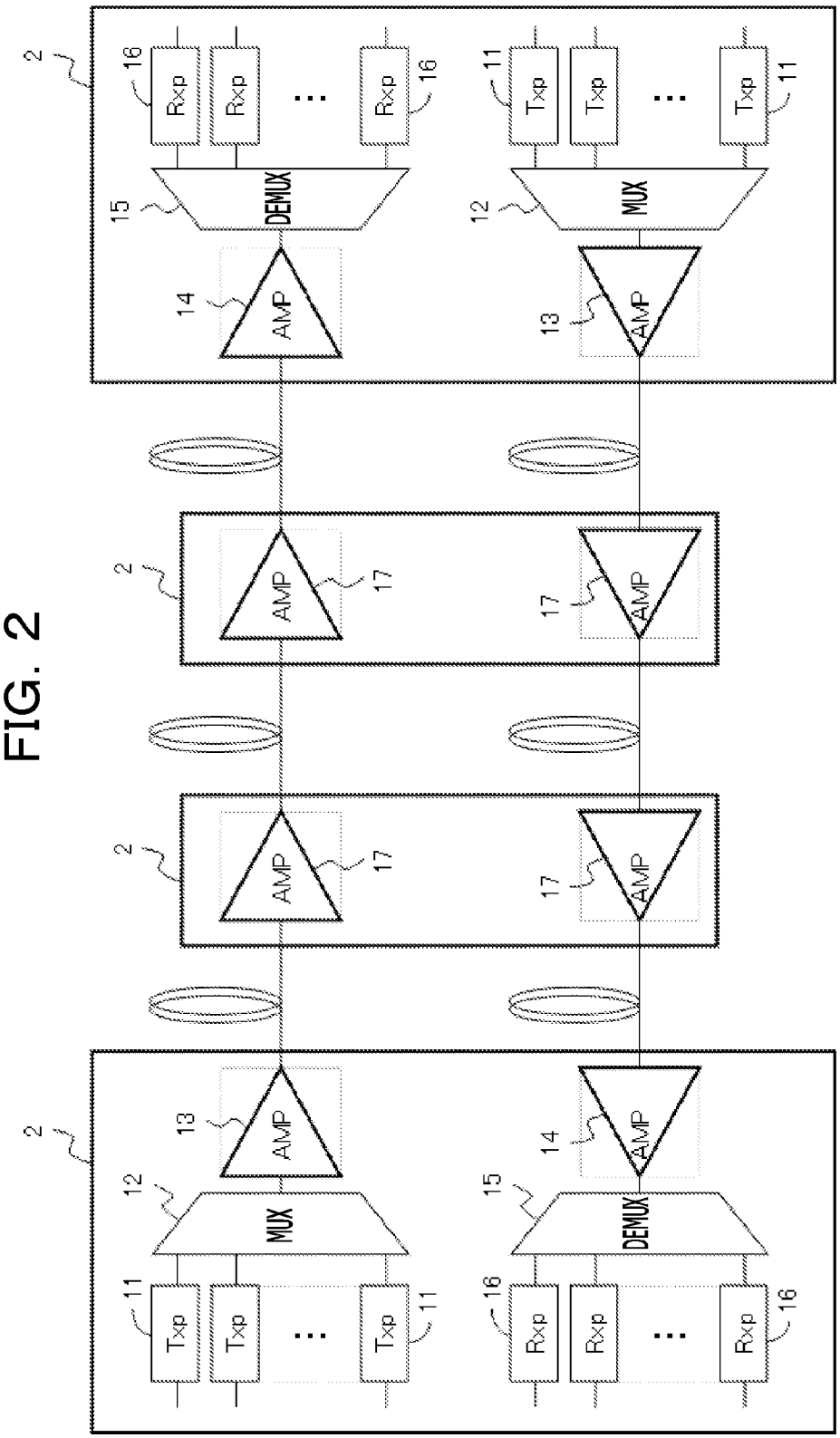
FIG. 2 illustrates an example of the configuration of a WDM transmission device.

FIG. 2 illustrates an example of the configuration of the WDM transmission device 2. The WDM transmission device 2 includes, as illustrated in FIG. 2, a plurality of transmitters (Txp) 11, a multiplexer (MUX) 12, optical amplifiers (AMPs) 13 and 14, a demultiplexer (DEMUX) 15, and a plurality of receivers (Rxp) 16.

The plurality of transmitters 11 generate optical signals at different wavelengths. The wavelength range of the plurality of transmitters 11 is from 1531 to 1563 nm, for example. The multiplexer 12 multiplexes a plurality of optical signals generated by the plurality of transmitters 11 to generate a WDM signal. The optical amplifier 13 amplifies the WDM signal generated by the multiplexer 12. The optical amplifier 14 amplifies received WDM signals. The demultiplexer 15 separates, by wavelength, the WDM signals amplified by the optical amplifier 14. The plurality of receivers 16 receive optical signals at the respective wavelengths.

The WDM transmission device 2, when used as an ILA, does not have to include the transmitters 11, the multiplexer 12, the demultiplexer 15, and the receivers 16. In this case, the WDM transmission device 2 includes an optical amplifier 17 for amplifying WDM signals. The intervals at which ILAs are provided on an optical transmission path are about 40 to 100 km, for example.

Figure 3:
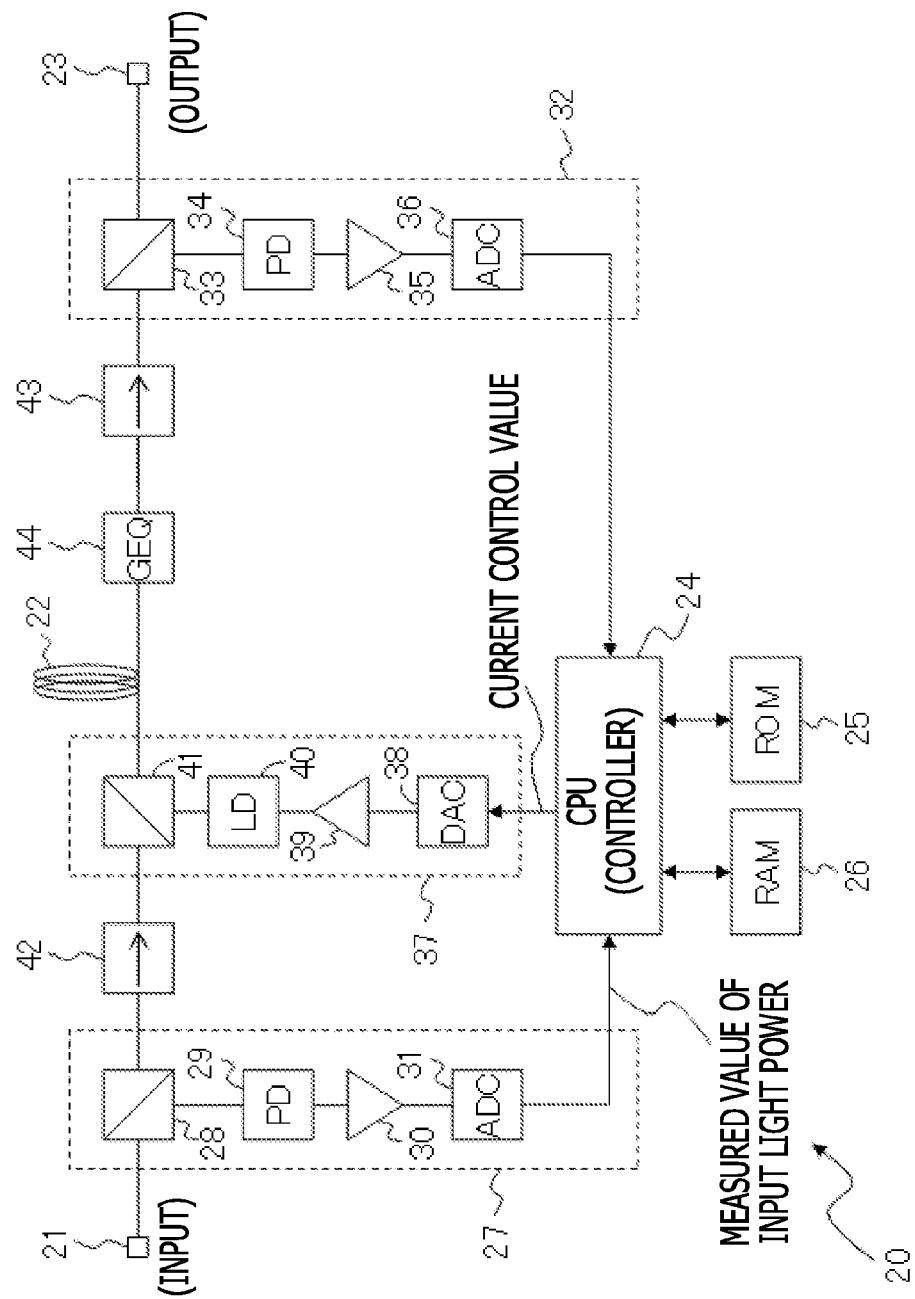
FIG. 3 illustrates an example of an optical amplifier of the embodiments of the present disclosure.

FIG. 3 illustrates an example of an optical amplifier of the embodiments of the present disclosure. An optical amplifier 20, in the example illustrated in FIG. 2, is used as the optical amplifier 13, 14, or 17.

The optical amplifier 20 includes an input connector 21, an erbium doped fiber (EDF) 22, and an output connector 23. WDM signals input through the input connector 21 are guided to the EDF 22. The EDF 22 acts as an optical amplification medium when excitation light is supplied thereto. Here, the EDF 22 is designed to amplify WDM signals transmitted in the optical transmission system 1 in a collective manner. Accordingly, the EDF 22 amplifies the input WDM signals in a collective manner. Then, the WDM signals amplified in the EDF 22 are output through the output connector 23.

The optical amplifier 20 further includes a central processing unit (CPU) 24. The CPU 24 operates as a controller that controls operations of the optical amplifier 20. The CPU 24 may control operations of the optical amplifier 20 utilizing programs stored in a memory (read-only memory (ROM)) 25, for example. The memory 25 may store other programs, data, and information. The CPU 24 stores measured values of input light power and values representing excitation light power in a memory (random access memory (RAM)) 26. Additionally, the CPU 24 is capable of reading the measured values of input light power and values representing excitation light power stored in the memory 26. The memory 26 may be used for storing other data or information.

The optical amplifier 20 includes an input power measuring circuit 27 that measures the input light power of the optical amplifier 20 (or the input light power of the EDF 22). The input power measuring circuit 27 includes an optical beam splitter 28, a photodetector (PD) 29, an amplifier 30, and an analog-to-digital (A/D) converter 31. An optical beam splitter 28 causes an input WDM signal to branch off and guides the WDM signal to the photodetector 29. The photodetector 29 generates a current signal representing the light power of the WDM signal guided from the optical beam splitter 28. The amplifier 30 converts the current signal generated by the photodetector 29 into a voltage signal. The A/D converter 31 converts the voltage signal generated by the amplifier 30 into digital data. This digital data represents the light power of the input WDM signal. Then, the CPU 24 acquires digital data representing light power of the input WDM signal at predetermined time intervals from the input power measuring circuit 27.

The optical amplifier 20 includes an output power measuring circuit 32 for measuring output light power of the optical amplifier 20. The output power measuring circuit 32 includes an optical beam splitter 33, a photodetector (PD) 34, an amplifier 35, and an A/D converter 36. The optical beam splitter 33 causes a WDM signal amplified by the EDF 22 to branch off and guides the WDM signal to the photodetector 34. The photodetector 34 generates a current signal representing the light power of the WDM signal guided from the optical beam splitter 33. The amplifier 35 converts the current signal generated by the photodetector 34 into a voltage signal. The A/D converter 36 converts the voltage signal generated by the amplifier 35 into digital data. The digital data represents the light power of the WDM signal amplified by the EDF 22. The CPU 24 is capable of acquiring digital data representing the light power of the amplified WDM signal at predetermined time intervals from the output power measuring circuit 32.

The CPU 24 controls excitation light based on the light power of the input WDM signal measured by the input power measuring circuit 27, and the light power of the output WDM signal measured by the output power measuring circuit 32. At this point, the CPU 24 generates a current control value representing a driving current for controlling excitation light.

The optical amplifier 20 includes an excitation light generator 37 for supplying excitation light to the EDF 22. The excitation light generator 37 includes a digital-to-analog (D/A) converter 38, an amplifier 39, a laser light source 40, and a WDM coupler 41. The D/A converter 38 converts the current control value generated by the CPU 24 into an analog signal. The amplifier 39 converts the analog signal output from the D/A converter 38 into a current signal. The laser light source 40 is driven by the current signal supplied from the amplifier 39 to generate continuous light, that is, excitation light at a predetermined wavelength. The WDM coupler 41 guides the excitation light generated by the laser light source 40 to the EDF 22.

The optical amplifier 20 may include an optical isolator 42 between the optical beam splitter 28 and the WDM coupler 41. The optical amplifier 20 may include an optical isolator 43 between the EDF 22 and the optical beam splitter 33. Additionally, the optical amplifier 20 may include a gain equalizer (GEQ) 44 between the EDF 22 and the optical beam splitter 33.

The optical amplifier 20 amplifies a WDM signal in the automatic gain control (AGC) mode, for example. In this case, the CPU 24 controls power of excitation light so that the gain in the EDF 22 is maintained to be fixed. The gain in the EDF 22 is calculated based on the ratio of the light power of the input WDM signal to the light power of the output WDM signal.

In the optical amplifier 20 having the configuration described above, the CPU 24 stores measured values of input light power obtained by the input power measuring circuit 27 in the memory 26. Thus, the CPU 24 may refer to the measured values of past input light power by accessing the memory 26. The input power measuring circuit 27 continuously measures input light power. Then, the CPU 24 acquires the measured values of input light power from the input power measuring circuit 27 at regular intervals, and stores the acquired values in the memory 26. Therefore, the CPU 24 may learn changes in the past input light power by accessing the memory 26.

The CPU 24 stores a current control value given from the CPU 24 to the excitation light generator 37 in the memory 26. Here, the excitation light generator 37 generates excitation light with a power corresponding to the current control value and supplies the generated excitation light to the EDF 22. That is, the current control value substantially represents excitation light power. The CPU 24 generates a current control value at regular intervals and provides it to the excitation light generator 37, and stores the generated current control value in the memory 26. Therefore, the CPU 24 may learn changes in the past excitation light power by accessing the memory 26.

However, data (the measured value of input light power and the current control value) for which a predetermined time period has elapsed since the data was written in the memory 26 may be deleted from the memory 26. That is, the memory 26 may have a configuration in which only data written therein during a predetermined time period immediately preceding the current time point is held.

Figure 4:
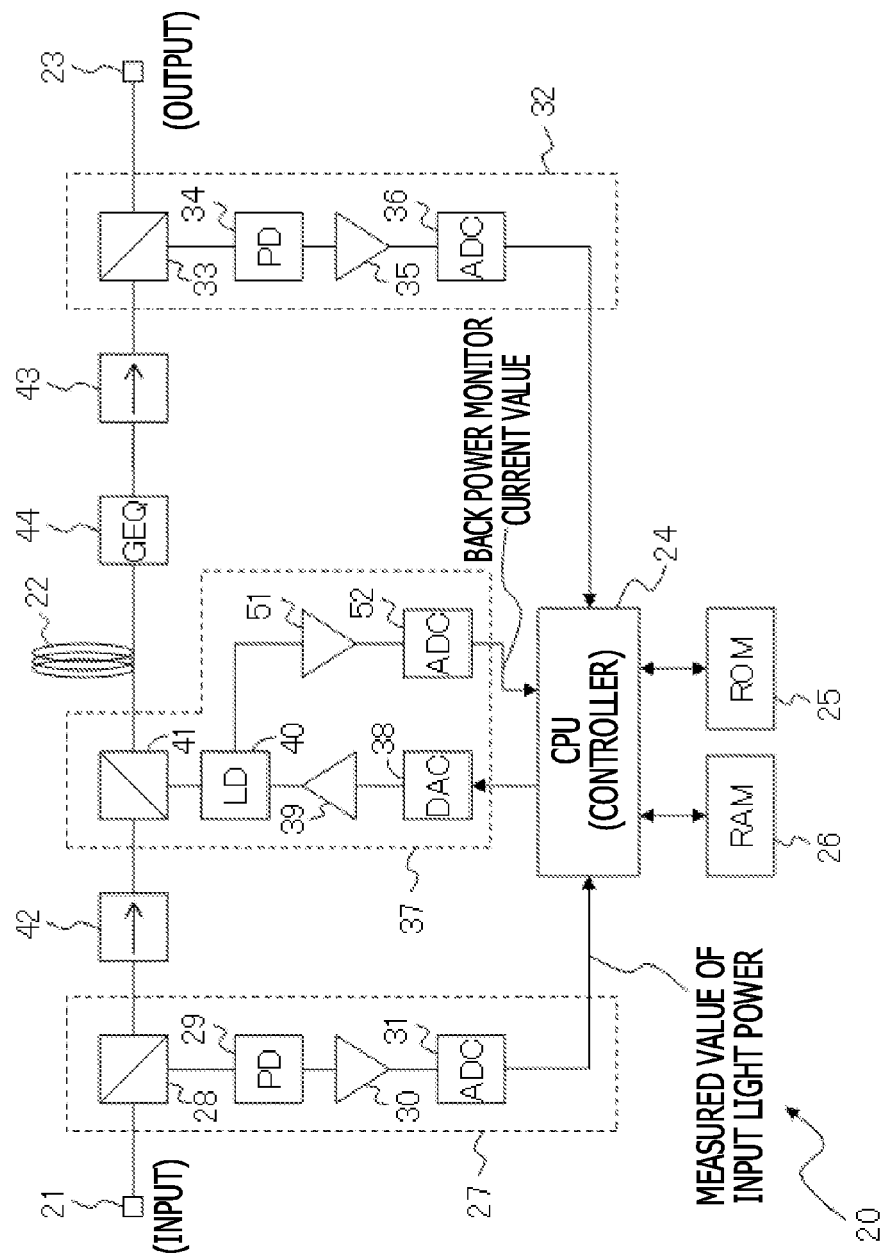
FIG. 4 illustrates a configuration of an optical amplifier of another embodiment.

FIG. 4 illustrates a configuration of an optical amplifier of another embodiment. In the configuration illustrated in FIG. 3, the current control value is stored as data representing excitation light power in the memory 26. In contrast to this, in the configuration illustrated in FIG. 4, a value representing a back power monitor current of the laser light source 40 is stored as data representing excitation light power in the memory 26.

In FIG. 4, the laser light source 40 outputs a back power monitor current. The back power monitor current substantially represents the power of excitation light generated by the laser light source 40. The amplifier 51 converts the back power monitor current into a voltage signal. An A/D converter 52 converts the voltage signal generated by the amplifier 51 into digital data. This digital data represents the back power monitor current. That is, this digital data indicates the excitation light power. Then, the CPU 24 stores the back power monitor current value as data indicating the excitation light power in the memory 26.

The CPU 24 acquires a back power monitor current value from the excitation light generator 37 at regular intervals, and stores the acquired value in the memory 26. Therefore, the CPU 24 may learn changes in the past excitation light power by accessing the memory 26. The configurations in FIG. 3 and FIG. 4 are substantially the same except for the circuit for monitoring excitation light power.

As such, in the configuration illustrated in FIG. 3, excitation light power is represented by the current control value that indicates the driving current of the laser light source 40. In the configuration illustrated in FIG. 4, excitation light power is represented by the back power monitor current value of the laser light source 40. That is, the current control value is an example of a value representing excitation light power, and the back power monitor current value is another example of a value representing excitation light power.

In the optical amplifier 20 illustrated in FIG. 3 or FIG. 4, if input light power changes, the CPU 24 controls excitation light so that gain specified in advance is maintained. For example, if input light power falls, the CPU 24 decreases excitation light power so that the gain specified in advance is maintained. Conversely, if input light power rises, the CPU 24 increases excitation light power so that the gain specified in advance is maintained. In this way, the optical amplifier 20 may operate in the AGC mode in which the gain is maintained to be fixed.

The optical amplifier 20 in the above configuration has the function of detecting a failure in the optical amplifier 20 based on excitation light power and input light power. For example, it is assumed that the gain of the optical amplifier 20 has fallen because of a failure occurring inside the optical amplifier 20. In this case, the CPU 24 increases excitation light power in order to recover the gain. Accordingly, the change in excitation light power may be used as one parameter for detecting a failure in the optical amplifier 20.

In the AGC mode, however, excitation light power changes even when the input light power of the optical amplifier 20 changes. For example, the input light power of the optical amplifier 20 increases when the number of wavelengths of a WDM signal increases, and therefore excitation light power for securing the fixed gain also increases. Accordingly, in the failure detection method of the embodiments, it is determined whether a change in excitation light power is caused by a change in input light power or caused by a failure in the optical amplifier 20. Then, if the change in excitation light power is caused by a change in input light power, it is determined that there is no failure in the optical amplifier 20. Otherwise, if the change in excitation light power is not caused by a change in input light power, it is determined that there is a failure in the optical amplifier 20.

However, when the change in excitation light power is caused by a change in input light power, the input light power has changed before the change of the excitation light power. That is, in order to determine whether the change in excitation light power is caused by a change in input light power, the measured values of past input light power are used. Accordingly, the optical amplifier 20 of the embodiments stores the measured values of the past input light power in the memory 26. Then, when excitation light power changes such that the change amount is larger than a predetermined threshold, it is determined whether a failure has occurred in the optical amplifier 20, using measured values of the past input light power stored in the memory 26.

First Embodiment

Figure 5:
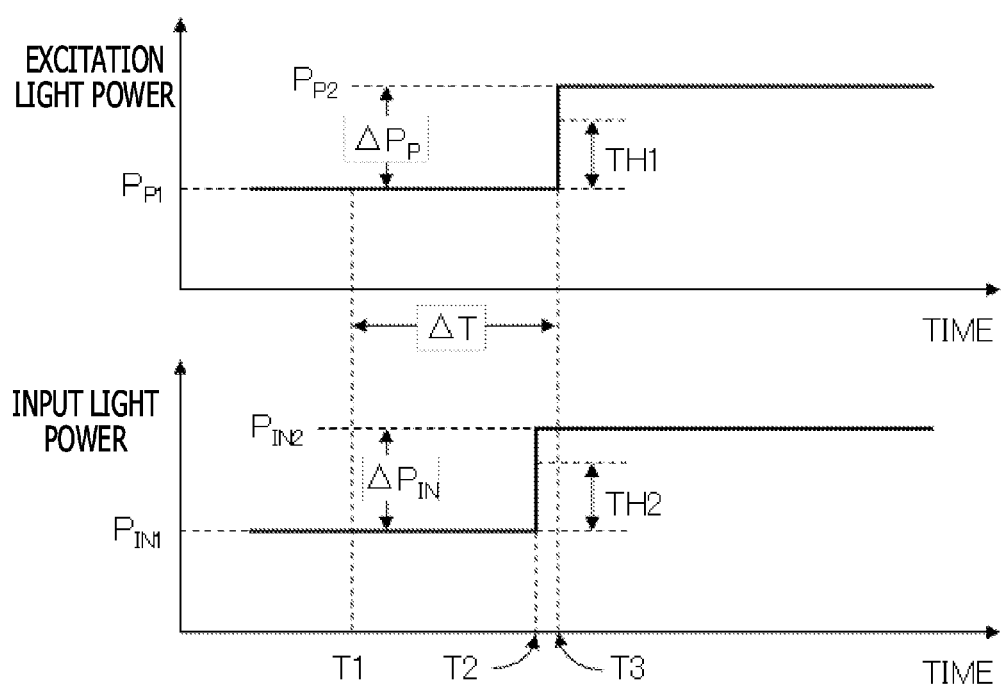
FIG. 5 illustrates operations of the optical amplifier in a first embodiment (part 1)
Figure 6:
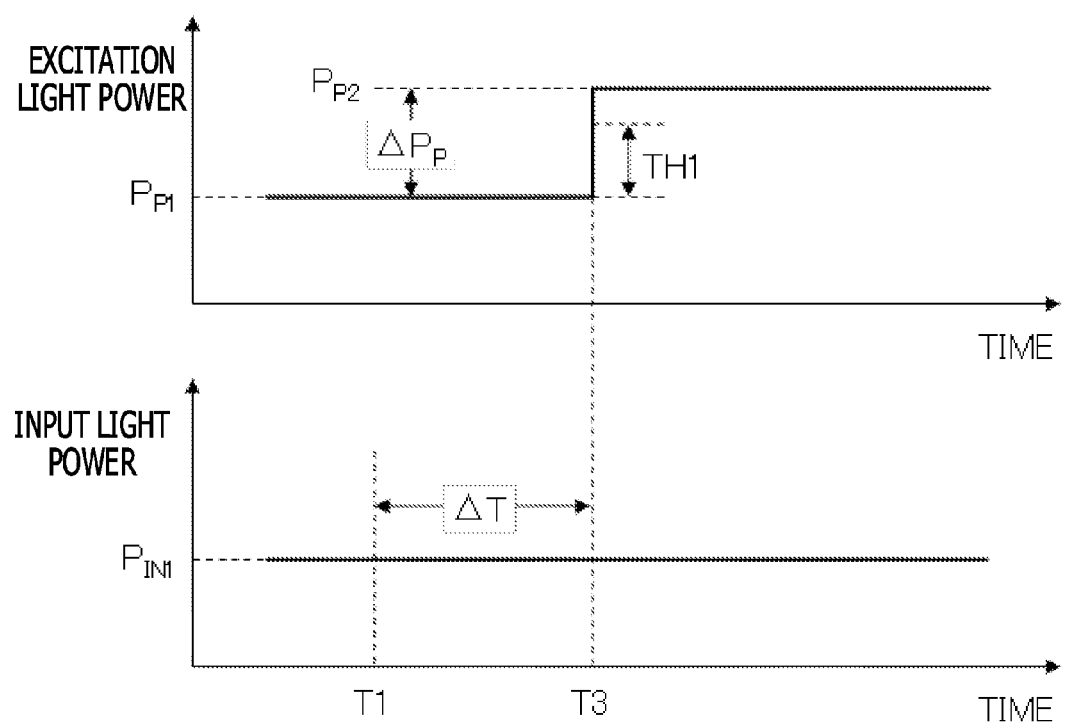
FIG. 6 illustrates operations of the optical amplifier in the first embodiment (part 2)

FIG. 5 and FIG. 6 illustrate operations of the optical amplifier 20 in the first embodiment. The optical amplifier 20 is assumed to operate in the AGC mode in which the gain is maintained to be fixed.

As described above, the optical amplifier 20 acquires the measured value of input light power and the value representing excitation light power at regular intervals, and stores the acquired values in the memory 26. The value representing excitation light power is a current control value with the configuration illustrated in FIG. 3, and is a back power monitor current value with the configuration illustrated in FIG. 4. The measured value of input light power and the value representing excitation light power are stored in the memory 26 at intervals of 1 ms, for example. In the below description, the value representing excitation light power (a current control value or a back power monitor current value) is sometimes referred to simply as "excitation light power".

In the example illustrated in FIG. 5, the input light power changes from $P_{IN1}$ to $P_{IN2}$ at a time point T2. When the input light power changes, the CPU 24 controls excitation light power so that specified gain is maintained. That is, feedback control in the AGC mode is carried out. Thereby, at a time point T3, the excitation light power changes from $P_{P1}$ to $P_{P2}$. The time period between the time point T2 and the time point T3 is equivalent to a delay in feedback control.

The CPU 24 monitors changes in excitation light power at all times. For example, the CPU 24 monitors changes in excitation light power by detecting excitation light power at intervals of 1 ms. At this point, every time the CPU 24 detects excitation light power, the CPU 24 calculates a difference between excitation light power newly detected and the immediately preceding excitation power, for example, as the amount of change in excitation light power. Alternatively, the CPU 24 may calculate a difference between the past excitation light power and the current excitation light power, as an amount of change in excitation light power. The term "past excitation light power" refers to excitation light power at a time point preceding the current time point by a predetermined time period. Then, the CPU 24 determines whether the amount of change in excitation light power exceeds an excitation light change threshold TH1 specified in advance. The excitation light change threshold TH1 is not limited, and is determined based on the current excitation light power, for example. By way of an example, the excitation light change threshold TH1 is set to a value of about 5% of the current excitation light power. Alternatively, the excitation light change threshold TH1 may be a fixed value specified in advance. The excitation light change threshold TH1, however, is preferably set to, for example, a value larger than the maximum variation range of excitation light power due to temperature change or the like.

In the embodiment illustrated in FIG. 5, the CPU 24 detects an amount of change $\Delta P_P$ larger than the excitation light change threshold TH1 at the time point T3. Here, $\Delta P_P$ indicates a difference between the excitation light power $P_{P1}$ and the excitation light power $P_{P2}$, and $P_{P2}$ indicates excitation light power newly detected at the time point T3. The CPU 24 is able to acquire the excitation light power $P_{P1}$ by accessing the memory 26.

When detecting a change in excitation light power larger than the excitation light change threshold TH1, the CPU 24 accesses the memory 26 and examines measured values of past input light power. At this point, the CPU 24 determines whether the amount of change in input light power exceeds the input power change threshold TH2 specified in advance in a time period from a time point at which the amount of change in excitation light power exceeds the excitation light change threshold TH1 to a time point preceding that time point by the predetermined time period $\Delta T$. The input light change threshold TH2 is not limited, and is determined based on the current input light power, for example. By way of an example, the input light change threshold TH2 is set to a value of about 5% of the current input light power. Alternatively, the input light change threshold TH2 may be a fixed value specified in advance. The input light change threshold TH2, however, is preferably set to a value with which the change in the number of wavelengths of a WDM signal is able to be detected.

In the example illustrated in FIG. 5, at the time point T3, the amount of change in excitation light power exceeds the excitation light change threshold TH1. Here, the time point preceding the time point T3 by the time period $\Delta T$ is T1. Accordingly, the CPU 24 calculates the amount of change in input light power in a time period from T1 to T3. As a result, $\Delta P_{IN}$ is obtained as illustrated in FIG. 5. Here, $\Delta P_{IN}$ indicates a difference between the input light power $P_{IN1}$ measured at the time point T1 and the input light power $P_{IN2}$ measured at the time point T3. The CPU 24 is able to obtain the input light power $P_{IN1}$ measured at the time point T1 by accessing the memory 26.

The CPU 24 determines whether a failure has occurred inside the optical amplifier 20, based on a change in input light power in the time period from T1 to T3. In the example illustrated in FIG. 5, the amount of change $\Delta P_{IN}$ in input light power in the time period from T1 to T3 is larger than the input power change threshold TH2. In this case, it is considered that the change in excitation light power at the time point T3 is caused by a change in input light power. Accordingly, in this case, the CPU 24 determines that a failure has not occurred inside the optical amplifier 20.

Also in the embodiment illustrated in FIG. 6, the amount of change in excitation light power larger than the excitation light change threshold TH1 is detected at the time point T3. For this reason, the CPU 24 calculates the amount of change in input light power in the time period from T1 to T3.

In the example illustrated in FIG. 6, however, the input light power is almost fixed in the time period from T1 to T3. That is, the amount of change in input light power in the time period from T1 to T3 is smaller than the input power change threshold TH2 mentioned above. In this case, it is considered that the change in excitation light power at the time point T3 is not caused by a change in input light power. In other words, it is considered that the cause of the change in excitation light power at the time point T3 lies in the optical amplifier 20. Accordingly, in the case illustrated in FIG. 6, the CPU 24 determines that a failure has occurred inside the optical amplifier 20.

The predetermined time period $\Delta T$ mentioned above is set to be longer than the operating time of a feedback system for controlling gain in the optical amplifier 20, for example. By way of an example, when input light power and excitation light power are sampled at intervals of 1 ms, $\Delta T$ is about 10 ms.

FIG. 7 is a flowchart illustrating a failure detection method in the first embodiment. The process of this flowchart is performed by the CPU 24. The CPU 24 performs a process of acquiring a measured value of input light power and a value representing excitation light power at regular intervals and storing the values in the memory 26, in parallel with the failure detection process illustrated in FIG. 7.

At step (hereinafter abbreviated as "S") 1, the CPU 24 monitors excitation light power. As described above, in the configuration illustrated in FIG. 3, the CPU 24 acquires a current control value, which indicates the driving current of the laser light source 40, as a value representing excitation light power. In the configuration illustrated in FIG. 4, the CPU 24 detects a back power monitor current as a value representing excitation light power.

At S2, the CPU 24 compares the amount of change in excitation light power with the excitation light change threshold TH1. Then, if the amount of change in excitation light power is larger than the excitation light change threshold TH1, the process of the CPU 24 proceeds to S3. Otherwise, if the amount of change in excitation light power is equal to or less than the excitation light change threshold TH1, the process of the CPU 24 returns to S1. That is, the operations of S1 to S2 are repeatedly performed during the period in which the amount of change in excitation light power is equal to or less than the excitation light change threshold TH1.

At S3, the CPU 24 refers to changes in the past input light power. The data indicating changes in the past input light power is stored in the memory 26. At this point, the CPU 24 refers to a change in input light power in a time period from a time point at which the amount of change in excitation light power exceeds the excitation light change threshold TH1 to a time point preceding that time point by the predetermined time period $\Delta T$.

At S4, the CPU 24 compares the amount of change in input light power with the input power change threshold TH2. Then, if the amount of change in input light power is smaller than the input power change threshold TH2, the process of the CPU 24 proceeds to S5. In this case, at S5, the CPU 24 outputs a signal or message indicating that a failure has occurred inside the optical amplifier 20.

If the amount of change in input light power is equal to or larger than the input power change threshold TH2, it is considered that the change in excitation light power detected at S2 is caused by a change in input light power. In this case, the CPU 24 determines that the change in excitation light power is not caused by a failure in the optical amplifier 20. Accordingly, the process of the CPU 24 returns to S1.

In this way, with the configuration of the embodiment of the present disclosure, the influence resulting from a change in input light power is removed using a method of detecting a failure in an optical amplifier by making use of a change in excitation light power. That is, it is possible to make a determination as to whether a change in excitation light power is caused by a change in input light power or by a failure in an optical amplifier. Accordingly, a failure in an optical amplifier may be appropriately detected.

In a WDM transmission system, a change in the number of wavelengths of a WDM signal is notified to the corresponding node devices. For this reason, when the excitation light power of an optical amplifier changes in response to a change in the number of wavelengths of a WDM signal, the CPU 24 is able to recognize that the change in excitation light power is caused by the change in the number of wavelengths of the WDM signal, based on the above notification. However, when a failure occurs in a channel used for notification of the number of wavelengths of a WDM signal, for example, the CPU 24 is not able to recognize a change in the number of wavelengths of a WDM signal in some cases. Accordingly, the detection method of the embodiment of the present disclosure also contributes to improving the accuracy of detecting a failure in an optical amplifier in a transmission system in which node devices are notified of the number of wavelengths of a WDM signal.

Second Embodiment

In the first embodiment, failure in such a manner that the excitation light power (or gain) of the optical amplifier 20 abruptly changes is detected. In an optical amplifier, however, failure sometimes occurs in such a manner that the performance deteriorates slowly over a long time. For example, failure might occur in such a manner that the performance of a laser light source gradually deteriorates for about one week.

Accordingly, in a second embodiment, the optical amplifier 20 holds the measured valued of input light power and values representing excitation light power over a long time period. By way of an example, the optical amplifier 20 holds data indicating input light power and excitation light power for the past 200 hours.

However, the capacity of a memory would be large if the memory is intended to store the 200-hour data. For this reason, the optical amplifier 20 reduces memory capacity using a method described below. In the below description, it is assumed that the measured value of input light power and the value representing excitation light power are sampled at intervals of 1 ms and are stored in the memory 26.

The sampling data stored in the memory 26 is held in its original state in the memory 26 for 1 min. That is, sampling data that is collected for 1 min immediately preceding the current time point is stored in the memory 26 at intervals of 1 ms. Here, provided that the amount of information of one sampling data is 2 bytes, the memory capacity for storing the data for the immediately preceding 1 min is as follows. 60×1000×2=120 kbyte In contrast, sampling data that is collected in the past preceding the current time point by more than 1 min is left in the memory 26 at intervals of 1 min. In this case, the memory capacity for storing the 200-hour data is as follows. 200×60×2=24 kbyte FIG. 8 is a flowchart illustrating a failure detection method in the second embodiment. The process of this flowchart is performed by the CPU 24. The CPU 24 performs a process of acquiring a measured value of input light power and a value representing excitation light power at regular intervals and storing the values in the memory 26, in parallel with the failure detection process illustrated in FIG. 8. As a result, as described above, measured values of input light power and values representing excitation light power for the past 200 hours with respect to the current time point are stored in the memory 26.

At S11, the CPU 24 calculates reference excitation light power $p_0$. The reference excitation light power $p_0$ is obtained by calculating the average of excitation light power detected at a plurality of different time points, for example.

At S12, the CPU 24 calculates reference input light power $i_0$. The reference input light power $i_0$ is obtained by calculating the average of input light power detected at a plurality of different time points, for example. The CPU 24 may perform the operation of S11 and the operation of S12 in parallel.

At S13, the CPU 24 determines whether the number of wavelengths of a WDM signal has changed. The number of wavelengths of a WDM signal is notified from a network management system or the adjacent node, for example. Alternatively, the CPU 24 may detect the number of wavelengths of a WDM signal by monitoring the power of each wavelength channel of an input WDM signal. Then, if the number of wavelengths of a WDM signal has not changed, the process of the CPU 24 proceeds to S14.

At S14, the CPU 24 determines whether 200 hours have elapsed since the operations of S11 and S12 were performed. Then, if 200 hours have not yet elapsed since the operations of S11 and S12 were performed, the process of the CPU 24 proceeds to S15.

When the number of wavelengths of a WDM signal has changed, or when 200 hours have elapsed since the operations of S11 and S12 were performed, the process of the CPU 24 returns to S11. That is, when the number of wavelengths of a WDM signal has changed, or when 200 hours have elapsed since the operations of S11 and S12 were performed, new reference excitation light power $p_0$ and new reference input light power $i_0$ are calculated.

At S15, the CPU 24 detects excitation light power $p_c$. The excitation light power $p_c$ indicates excitation light power newly detected. The excitation light power $p_c$ may be excitation light power that has been finally detected. In this case, the CPU 24 is able to read the excitation light power $p_c$ from the memory 26.

At S16, the CPU 24 determines whether the difference between the reference excitation light power $p_0$ and the excitation light power $p_c$ is larger than a predetermined threshold. The threshold may be the same as the excitation light change threshold TH1 of the first embodiment. Then, if the difference between the reference excitation light power $p_0$ and the excitation light power $p_c$ is larger than the threshold, the process of the CPU 24 proceeds to S17. Otherwise, if the difference is equal to or less than the threshold, the process of the CPU 24 returns to S13.

At S17, the CPU 24 detects input light power $i_c$. The input light power $i_c$ indicates input light power newly detected. The input light power $i_c$ may be input light power that has been detected finally. In this case, the CPU 24 is able to read the input light power $i_c$ from the memory 26.

At S18, the CPU 24 determines whether the difference between the reference input light power $i_0$ and the input light power $i_c$ is smaller than a predetermined threshold. The threshold may be the same as the input power change threshold TH2 of the first embodiment.

If the difference between the reference input light power $i_0$ and the input light power $i_c$ is smaller than the threshold, it is considered that the change in excitation light power detected at S16 is not caused by a change in input light power. In this case, at S19, the CPU 24 outputs a signal or message indicating that a failure has occurred inside the optical amplifier 20.

If the difference between the reference input light power $i_0$ and the input light power $i_c$ is equal to or larger than the threshold, it is considered that the change in excitation light power detected at S16 is caused by a change in input light power. In this case, the CPU 24 determines that the change in excitation light power is not caused by a failure in the optical amplifier 20. Accordingly, in this case, the process of the CPU 24 returns to S13.

In this way, with the configuration of the embodiment of the present disclosure, a failure in such a manner that the performance deteriorates slowly over a long time may also be detected in an optical amplifier. At this point, the influence resulting from a change in input light power is removed, and therefore a failure in the optical amplifier is detected appropriately.

The optical amplifier 20 may perform both of the detection method of the first embodiment and the detection method of the second embodiment. In this case, the optical amplifier 20 is able to detect both of a failure in which the performance deteriorates abruptly and a failure in which the performance deteriorates slowly.

Third Embodiment

FIG. 9 is a flowchart illustrating a failure detection method in a third embodiment. The failure detection method of the third embodiment is a variation of the second embodiment. Accordingly, description of operations common to the second and third embodiments is omitted. In the failure detection method of the third embodiment, the operation of S12 illustrated in FIG. 8 does not have to be performed.

In the third embodiment, if a difference between the reference excitation light power $p_0$ and the excitation light power $p_c$ is larger than the threshold (Yes at S16), the process of the CPU 24 proceeds to S21. At S21, the CPU 24 identifies the change pattern of excitation light power. The change pattern of excitation light power is obtained by reading values representing the past excitation light power stored in the memory 26 and arranging the read values in time sequence. At S22, the CPU 24 identifies the change pattern of input light power. The change pattern of input light power is obtained by reading measured values of the past input light power stored in the memory 26 and arranging the read values in time sequence. As mentioned above, the measured values of input light power and the values representing excitation light power for the past 200 hours with respect to the current time point are stored in the memory 26.

At S23, the CPU 24 calculates a correlation between the change pattern of excitation light power and the change pattern of input light power. For example, if a timing at which excitation light power changes and a timing at which input light power changes are coincident or almost coincident, it is determined that the correlation between the two change patterns is high.

If the correlation between the two change patterns is low, it is considered that the change in excitation light power is not caused by a change in input light power. In this case, at S19, the CPU 24 outputs a signal or message indicating that a failure has occurred inside the optical amplifier 20.

If the correlation between the two change patterns is high, it is considered that the change in excitation light power is caused by a change in input light power. In this case, the CPU 24 determines that the change in excitation light power is not caused by a failure in the optical amplifier 20. Accordingly, in this case, the process of the CPU 24 returns to S13.

In this way, with the failure detection method of the third embodiment, based on the correlation between the change pattern of excitation light power and the change pattern of input light power, it is determined whether the change in excitation light power is caused by a change in input light power. Accordingly, with the method of the third embodiment, the accuracy of detecting a failure in an optical amplifier is higher as compared with the method of the second embodiment.

The optical amplifier 20 may perform both of the detection method of the first embodiment and the detection method of the third embodiment. In this case, the optical amplifier 20 is able to detect both of a failure in which the performance deteriorates abruptly and a failure in which the performance deteriorates slowly.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An apparatus, comprising:
    an optical amplifying fiber configured to receive input light so that the input light travels through the optical amplifying fiber;
    an excitation light generator configured to supply excitation light to the optical amplifying fiber to optically amplify the input light as the input light travels through the optical amplifying fiber; and
    a processor configured to:
        determine whether a failure has occurred in the optical amplifier, based on a change in power of the excitation light and a change in power of the input light,
        determine whether the failure has occurred in the optical amplifier, based on a result obtained by determining whether, when an amount of the change in power of the excitation light exceeds a first threshold, an amount of the change in power of the input light is smaller than a second threshold in a past predetermined time period.

2. The apparatus according to claim 1, wherein the processor is configured to determine that a failure has not occurred in the optical amplifier while the amount of the change in power of the input light is equal to or larger than the second threshold in the predetermined time period.

3. The apparatus according to claim 1, further comprising:
    a measuring circuit configured to measure power of the input light;

a memory configured to store measured values of power of the input light respectively measured at a plurality of different time points by the measuring circuit, wherein the processor determines whether a failure has occurred in the optical amplifier, based on the measured values of power of the input light stored in the memory, when the amount of the change in power of the excitation light exceeds the first threshold.

4. The apparatus according to claim 1, wherein the excitation light generator includes a laser light source configured to output the excitation light supplied to the optical amplifying fiber so that the excitation light has power corresponding to a driving current of the laser light source, and the processor monitors the amount of the change in power of the excitation light based on the driving current of the laser light source.

5. The apparatus according to claim 1, wherein the excitation light generator includes a laser light source configured to output the excitation light supplied to the optical amplifying fiber and to output a back power monitor current, and the processor monitors the amount of change in power of the excitation light based on the back power monitor current.

6. The apparatus according to claim 1, wherein the processor determines whether a failure has occurred in the optical amplifier, based on a correlation between a change pattern of the power of the excitation light and a change pattern of the power of the input light, when the amount of the change in power of the excitation light exceeds the first threshold.

7. The apparatus according to claim 1, wherein the processor is configured to:

calculate reference excitation light power representing an average of power of the excitation light detected at a plurality of different time points, calculate reference input light power representing an average of power of the input light detected at a plurality of different time points, determine that a failure has occurred in the optical amplifier, while a difference between the reference excitation light power and newly detected power of the excitation light exceeds the first threshold and a difference between the reference input light power and newly detected power of the input light is smaller than the second threshold, and determine that a failure has not occurred in the optical amplifier, while the difference between the reference excitation light power and the newly detected power of the excitation light exceeds the first threshold and the difference between the reference input light power and the newly detected power of the input light is equal to or larger than the second threshold.

8. The apparatus according to claim 4, wherein the processor calculates a current control value representing the driving current of the laser light source based on power of the input light before being received by the optical amplifying fiber and power of the input light after being amplified, the excitation light generator generates the excitation light to have power corresponding to the current control value, and the processor monitors the amount of change in power of the excitation light based on the current control value.

9. The apparatus according to claim 3, wherein the processor deletes from the memory the measured values of power of the input light for which a predetermined time period has elapsed since the measured values of power of the input light were stored in the memory.

10. The apparatus according to claim 7, wherein the processor controls capacity of a memory so that a sampling interval of a measured value of power of the input light measured during a time period before a time point preceding a current time point by a predetermined time period and a value representing power of the excitation light is longer than a sampling interval of a measured value of power of the input light measured on and after the time point preceding the current time point by the predetermined time period and a value representing power of the excitation light.

11. A failure detection method for detecting a failure in an optical amplifier having an optical amplifying fiber, the failure detection method comprising:

receiving, by an optical amplifying fiber, input light that travels through the optical amplifying fiber;

supplying, by an excitation light generator, excitation light to the optical amplifying fiber to optically amplify the input light as the input light travels through the optical amplifying fiber; and determining, by a processor, whether a failure has occurred in the optical amplifier, based on a change in power of the excitation light and a change in power of the input light, wherein the determining includes determining whether the failure has occurred in the optical amplifier, based on a result obtained by determining whether, when an amount of the change in power of the excitation light exceeds a first threshold, an amount of the change in power of the input light is smaller than a second threshold in a past predetermined time period.

12. The failure detection method according to claim 11, further comprising:

determining that a failure has not occurred in the optical amplifier while the amount of the change in power of the input light is equal to or larger than the second threshold in the predetermined time period.

13. The failure detection method according to claim 11, further comprising:

measuring, by a measuring circuit, power of the input light; and storing, in a memory, measured values of power of the input light respectively measured at a plurality of different time points by the measuring circuit, wherein the determining includes determining whether the failure has occurred in the optical amplifier, based on the measured values of power of the input light stored in the memory, when the amount of the change in power of the excitation light exceeds the first threshold.

14. The failure detection method according to claim 11, wherein the excitation light generator includes a laser light source configured to output the excitation light supplied to the optical amplifying fiber so that the excitation light has power corresponding to a driving current of the laser light source, and the failure detection method further comprises:

monitoring, by the processor, the amount of the change in power of the excitation light based on the driving current of the laser light source.

15. The failure detection method according to claim 11, wherein the excitation light generator includes a laser light source configured to output the excitation light supplied to the optical amplifying fiber and to output a back power monitor current, and the failure detection method further comprises:

monitoring, by the processor, the amount of change in power of the excitation light based on the back power monitor current.

16. An apparatus, comprising:
a memory, and
a processor coupled to the memory and configured to:
   receive input light that travels through the optical amplifying fiber;
   supply excitation light to the optical amplifying fiber to optically amplify the input light as the input light travels through the optical amplifying fiber; and
   determine whether a failure has occurred in the optical amplifier, based on a change in power of the excitation light and a change in power of the input light,
wherein the processor is configured to determine whether the failure has occurred in the optical amplifier, based on a result obtained by determining whether, when an amount of the change in power of the excitation light exceeds a first threshold, an amount of the change in power of the input light is smaller than a second threshold in a past predetermined time period.

17. The apparatus according to claim 16, wherein the processor is configured to determine that a failure has not occurred in the optical amplifier while the amount of the change in power of the input light is equal to or larger than the second threshold in the predetermined time period.

18. The apparatus according to claim 16, wherein the processor is configured to measure power of the input light; and
   store, in the memory, measured values of power of the input light respectively measured at a plurality of different time points by the measuring circuit,
   wherein the processor is configured to determine whether the failure has occurred in the optical amplifier, based on the measured values of power of the input light stored in the memory, when the amount of the change in power of the excitation light exceeds the first threshold.

19. The apparatus according to claim 16, wherein the excitation light generator includes a laser light source configured to output the excitation light supplied to the optical amplifying fiber so that the excitation light has power corresponding to a driving current of the laser light source, and
   the processor is configured to monitor the amount of the change in power of the excitation light based on the driving current of the laser light source.

* * * * *